(12) United States Patent
Bruguier et al.

(10) Patent No.: US 8,887,105 B1
(45) Date of Patent: Nov. 11, 2014

(54) CALIBRATION PATTERN SELECTION BASED ON NOISE SENSITIVITY

(71) Applicants: Antoine Jean Bruguier, Milpitas, CA (US); Wenjin Shao, Sunnyvalle, CA (US); Song Lan, Cupertino, CA (US)

(72) Inventors: Antoine Jean Bruguier, Milpitas, CA (US); Wenjin Shao, Sunnyvalle, CA (US); Song Lan, Cupertino, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/662,239

(22) Filed: Oct. 26, 2012

Related U.S. Application Data

(60) Provisional application No. 61/553,105, filed on Oct. 28, 2011.

(51) Int. Cl.
G06F 17/50 (2006.01)
(52) U.S. Cl.
USPC .................................. 716/52; 716/50; 716/51
(58) Field of Classification Search
USPC .................................................... 716/50–55
See application file for complete search history.

(56) References Cited

U.S. PATENT DOCUMENTS

| 6,573,986 | B2* | 6/2003 | Smith et al. | 356/124 |
| 6,853,514 | B2* | 2/2005 | Li et al. | 360/77.04 |
| 7,099,011 | B2* | 8/2006 | McArthur et al. | 356/401 |
| 7,689,968 | B2* | 3/2010 | Sato | 716/53 |
| 8,196,068 | B2* | 6/2012 | Zhang | 716/53 |

* cited by examiner

Primary Examiner — Sun Lin
(74) Attorney, Agent, or Firm — Pillsbury Winthrop Shaw Pittman LLP

(57) ABSTRACT

The preset invention provides methods, systems and computer program product for selection of an optimum set of patterns to calibrate a lithography model so that the model can predict imaging performance of a lithography apparatus/system more accurately and reliably without being prohibitively expensive in terms of using computational and metrology resources and time. The method is based on modeling sensitivity of the calibration patterns to measurement noise. In one aspect of the present invention, a method is disclosed, comprising: identifying a model of at least a portion of a lithographic process; identifying a set of patterns for calibrating the model; and, estimating measurement noise associated with the set of patterns.

20 Claims, 7 Drawing Sheets

CALIBRATION PATTERN SELECTION BASED ON NOISE SENSITIVITY

CROSS-REFERENCE TO RELATED APPLICATIONS

This application claims priority to U.S. Provisional Application No. 61/553,105 filed Oct. 28, 2011, which is incorporated herein by reference in its entirety.

COPYRIGHT AUTHORIZATION

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The technical field of the present invention relates generally to patterns for model calibration associated with a lithography process, and more specifically to selecting an optimal set of patterns from a larger set of patterns.

BACKGROUND OF THE INVENTION

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as "Moore's law". At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light. Even in the case of extreme ultraviolet (EUV) imaging with a wavelength of about 13.5 nm, an accurate model must capture the resist effects.

This process, in which features with dimensions smaller than the classical resolution limit of an optical projection system are printed, is commonly known as low-$k_1$ lithography, according to the resolution formula $CD=k_1 \times \lambda/NA$, where $\lambda$ is the wavelength of radiation employed, NA is the numerical aperture of the projection optics, CD is the "critical dimension"—generally the smallest feature size printed— and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as "resolution enhancement techniques" (RET).

As one important example, optical proximity correction (OPC, sometimes also referred to as "optical and process correction") addresses the fact that the final size and placement of a printed feature on the wafer will not simply be a function of the size and placement of the corresponding feature on the mask. It is noted that the terms "mask" and "reticle" are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of "sub-resolution assist" features that are not intended to print themselves, but will affect the properties of an associated primary feature.

The application of model-based OPC to a target design requires good process models and considerable computational resources, given the many millions of features typically present in a chip design. The OPC is essentially a very large optimization problem. In the general case, there is no closed-form solution to this problem, and OPC vendors use an approximate, iterative process that does not always resolve all possible weaknesses on a layout. Therefore, post-OPC designs, i.e. mask layouts after application of all pattern modifications by OPC and any other RET's, need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

OPC and other RET verification may be based on numerical modeling systems and methods, and commercial products are available based on the computational lithography ("CL") techniques that are developed for generic or specific lithography machines.

OPC and other RET require robust models that describe the lithography process precisely. Calibration procedures for such lithography models are thus required that provide models being valid, robust and accurate across the process window. Currently, calibration is done using a certain number of 1-dimensional and/or 2-dimensional gauge patterns with wafer measurements. More specifically, those 1-dimensional gauge patterns include, but are not limited to, line-space patterns with varying pitch and CD, isolated lines, multiple lines, etc. and the 2-dimensional gauge patterns typically include line-ends, contacts, and randomly selected SRAM (Static Random Access Memory) patterns. Those skilled in the arts will understand that the present invention is generic enough to accommodate any type of pattern. These patterns are then imaged onto a wafer and resulting wafer CDs and/or contact energy are measured. The original gauge patterns and their wafer measurements are then used jointly to determine the model parameters which minimize the difference between model predictions and wafer measurements.

In current practice, the selection of gauge patterns is rather arbitrary. They may simply be chosen from experience or randomly chosen from the real circuit patterns. Such patterns are often insufficient for calibration or too computationally-intensive due to redundancy. In particular, for some parameters, all the patterns may be quite insensitive thus it may be difficult to determine the parameter values due to measurement inaccuracies. While on the other hand, many patterns may have very similar responses to parameter variations thus some of them are redundant and wafer measurements on these redundant patterns waste a lot of resources.

Meanwhile, CL models need to accurately predict the actual on-wafer image contours across a very large collection of possible geometric layout patterns. Therefore, both the proper choice of the model formulation to be employed and the accurate determination of values for all model parameters are very important.

Moreover, in the calibration of a CL model, wafer CD measurements for the selected test patterns are needed to optimize the model parameters. Collecting such metrology data is often time-consuming and expensive. In light of this effort, for the OPC application, these calibrations are typically done only once per technology node per target layer. For CL products in manufacturing, these calibrations need to be done for many scanners and on a somewhat regular basis. Therefore, model calibration procedures should address the issue of how to minimize the number of test structures that need to be measured without compromising the prediction accuracy of the resulting model.

Traditional approaches in model calibration aim primarily to provide a good description of the imaging behavior of those patterns that are known to be important to the physical circuit design community. Typically, this involves a substantial number of pattern types, each instantiated over an appropriate range of geometric variations. One of the most important examples is line CD versus pitch for the poly layer, for a number of frequently used transistor channel lengths (poly line CD) and from dense lines (minimum pitch) to isolated lines. However, in modern lithography, the optical range of influence (ambit) is much larger than the typical test structure and therefore it is no longer true that accurate modeling of a pre-selected number of relatively small test patterns guarantees accurate prediction of these patterns in their actual circuit environments. Most of the geometry-based approaches are somewhat heuristic in nature, and are often prone to one or both of the following drawbacks.

The strong focus on predefined patterns means that there is no explicit consideration for proper coverage of model parameters and for guaranteeing that all the significant physical/chemical characteristics in a lithography process are suitably represented by these parameters. In the case of a model not based on first principle physics/chemistry, the predefined patterns similarly need to allow accurate calibration of the model's parameters. Due to a lack of discriminating patterns, patterns can be poorly determined or they can exhibit a high degree of degeneracy with other parameters. Either way, the methods routinely fail to properly describe the change in imaging behavior outside the conditions included in the model characterization. For some of the physical/chemical properties and associated model parameters that are captured by the calibration method, the approach is not economical and too many measurements provide essentially redundant information. Additionally, the current gauge selection methods are not easily generalizable. Every time a new gauge geometry is supplied, the user needs to establish new rules. If a gauge selection is done using a purely non-geometry-based approach, then specific features of a given gauge are ignored. Most of the traditional methods fail to provide a comprehensive way to select the gauges once their characterization is done. Finally, there is a need to have a model which can predict imaging performance for a full-chip design layout or a portion thereof.

SUMMARY OF THE INVENTION

The preset invention provides methods, systems and computer program product for selection of an optimum set of patterns to calibrate a lithography model so that the model can predict imaging performance of a lithography apparatus/system more accurately and reliably without being prohibitively expensive in terms of using computational and metrology resources and time. The method is based on modeling sensitivity of the calibration patterns to measurement noise. The lithography apparatus/process may be a physical system/process, or a virtual representation of the same in the simulation domain. The patterns may include patterns dedicated for testing only (such as line/space patterns), and/or patterns that are identified/extracted from an actual design layout that represents a chip to be imaged on a production wafer. The design layout may be a full-chip layout, or may include a portion of the full-chip layout. The terms 'gauge' or 'gauge pattern' or 'calibration pattern' have been used in the specification to indicate any pattern that is used to calibrate the lithography model. A set of patterns that provides a predefined representation of the behavior expected from the full design layout/full chip is defined as full-chip gauges. A gauge may include one or more patterns. A set of calibration patterns may include patterns from a set of 'clips' (portions of design layout, usually provided by the customer, or derived from a design layout) representing the full chip, or from a limited set of clips, including just one clip.

In one aspect of the present invention, a method is disclosed, comprising: identifying a model of at least a portion of a lithographic process; identifying a set of patterns for calibrating the model; and, estimating measurement noise associated with the set of patterns.

These and other aspects of the present invention, including systems and computer program products corresponding to the above methods, will be apparent to a person skilled in the art in view of the following drawings and detailed description.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE EXAMPLE EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
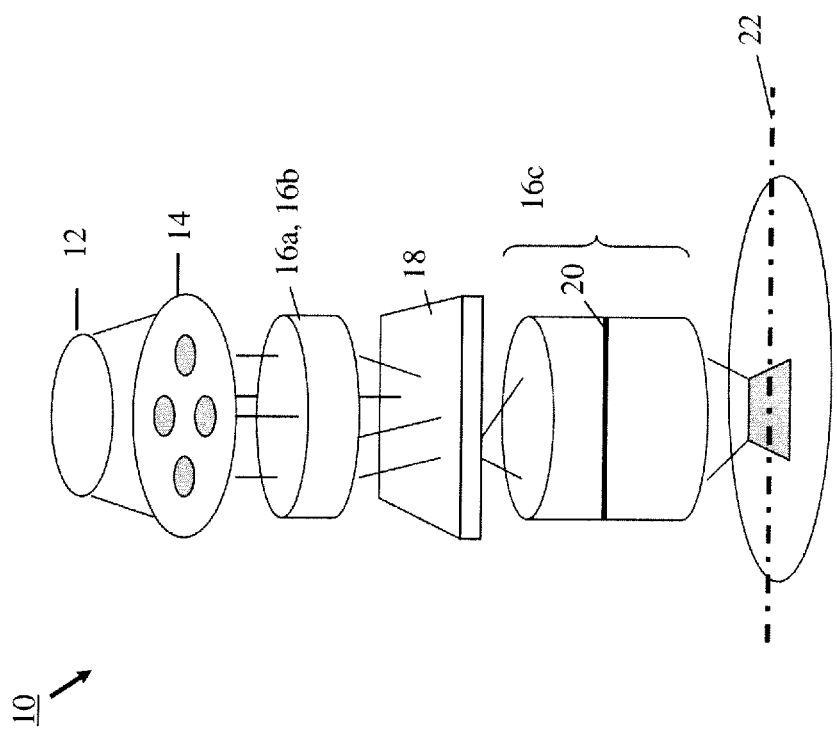
FIG. 1 is a block diagram of various subsystems of a lithography system according to example implementations of the present invention.

General Environment in a Lithography System for Implementing Example Embodiments of the Present Invention Prior to discussing the present invention, a brief discussion regarding the overall simulation and imaging process is provided. FIG. 1 illustrates an exemplary lithographic projection system 10. The major components are a light source 12, which may be, for example, a deep-ultraviolet excimer laser source, or a source of other wavelengths, including EUV wavelength, illumination optics, which define the partial coherence, and which may include specific source shaping optics 14, 16a and 16b; a mask or reticle 18; and projection optics 16*c* that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics NA=sin ($\Theta_{max}$).

Figure 2:
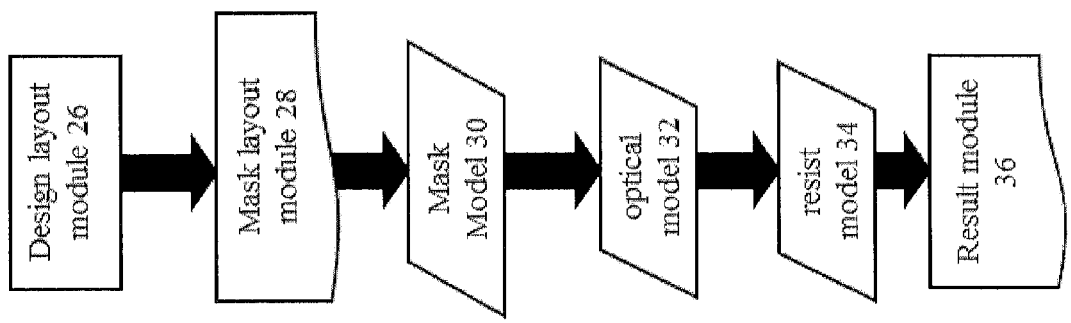
FIG. 2 is a block diagram of simulation models corresponding to the subsystems in FIG. 1.

In a lithography simulation system, these major system components can be described by separate functional modules, for example, as illustrated in FIG. 2. Referring to FIG. 2, the functional modules include the design layout module 26, which defines the target design; the mask layout module 28, which defines the mask to be utilized in imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma (σ) settings as well as any particular illumination source shape, where σ (or sigma) is outer radial extent of the illuminator. The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS. Those skilled in the art will understand that the input file format is irrelevant.

Example Methods of the Present Invention

In general, the connection between the optical and the resist model is a simulated aerial image within the resist layer, which arises from the projection of light onto the substrate, refraction at the resist interface and multiple reflections in the resist film stack. The light intensity distribution (aerial image) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

The CL model formulation is thus used to describe the known physics and chemistry. The CL model can either be based on first-principle physics/chemistry (e.g., a model derived from Maxwell's equations) or be empirical, i.e. based on experience and/or experimental observation. Some of the empirical models can be referred to as heuristic model, i.e. a model based on trial and errors. For physical models, one or more of the model parameters corresponds to a distinct physical or chemical effect; the model formulation may set bounds or constraints on how well the calibrated model can describe the reality.

The present inventors recognize that a pattern selection result (i.e. "pattern coverage") should therefore be able to excite all the known physics (including optics) and chemistry in the model formulation, making sure that the wafer data for the patterns can drive the model calibration to the parameter values that realize the constraints imposed by the formulation. Pattern selection does not change the physical and chemical effects contained in the model, but should preferably help to adequately excite these effects such that the degrees to which they manifest themselves in a specific lithography process can be efficiently identified based on the wafer measurements for the selected patterns. The insight here is that the method of determining what is an effective subset of patterns may depend on many factors, such as: whether the model is based on first-principles or is an empirical model, whether the goal is to select the fewest patterns to calibrate the model to make the process most efficient computationally, whether a predefined predictive accuracy goal is set, whether a customer has provided a preferred set of patterns that must be included in any subset, etc. Note that these are just illustrative examples, and do not limit the scope of the present invention.

Figure 3:
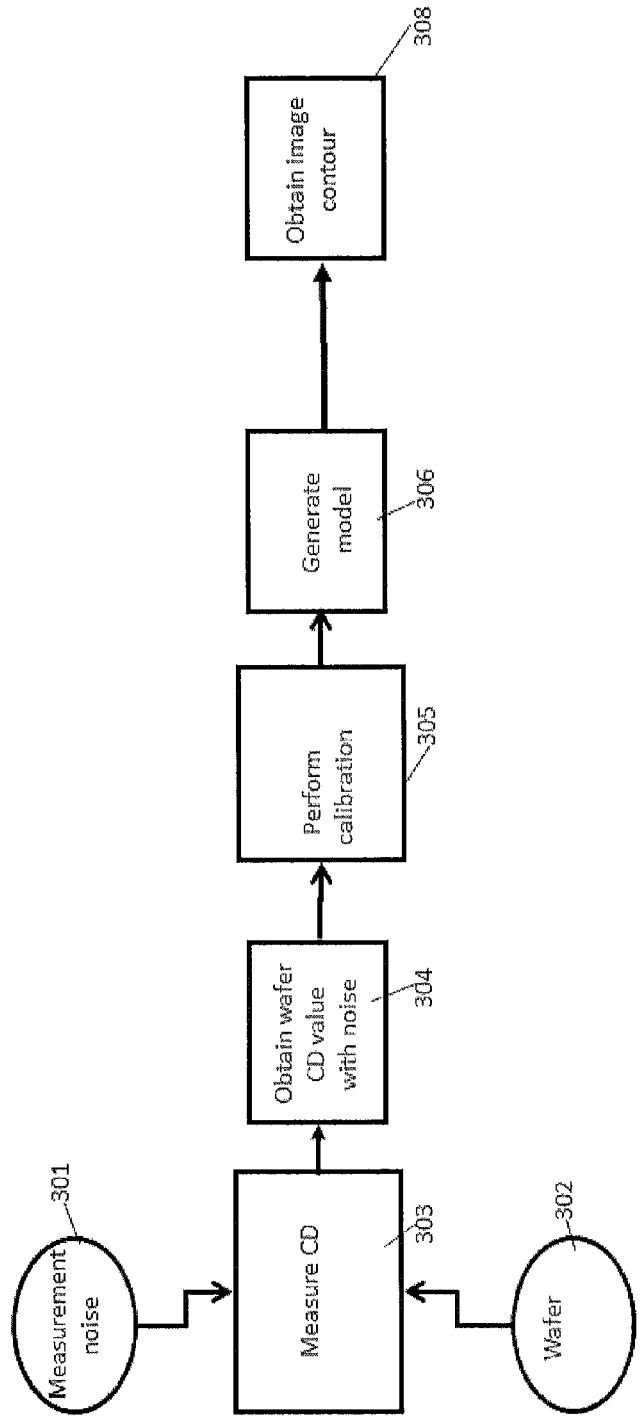
FIG. 3 is a flow diagram illustrating how measurement noise affects a final contour predicted by a lithographic model.

FIG. 3 describes how effect of the measurement noise dictates the accuracy of the contours of aerial image and/or resist image predicted by the lithography models. Note that in FIGS. 3-4, CD is used as a non-limiting example of lithography response that is measured/simulated as an indicator for assessing imaging performance. Other types of lithographic responses (e.g., position of a feature edge, angle of a sidewall, etc.) may also be used as the indicator for imaging performance. Similarly, the metric outputted by a model is not limited to image contour only. However, for ease of description, aerial/resist image contour is mentioned as the output of the model in the following description.

Referring back to FIG. 3, in a conventional approach, a wafer is obtained (block 302), and CD is measured (step 303) with a CD-SEM or other measurement device. The measurement is invariably contaminated by noise, as shown in block 301, and therefore, the measured CDs outputted in step 304 has noise. Next, a calibration step 305 is performed and a calibrated lithographic model is generated in step 306. The model generated in step 306 is characterized by coefficients that are part of a mathematical representation of the model parameters. Model parameters can represent physical parameters that can be controlled by a user in a physical apparatus, a virtual model thereof (e.g., intensity distribution parameter, polarization etc.). Model parameters can also represent abstract mathematical terms that represent certain physical effects, e.g. wavefront aberration terms, resist image terms etc. The coefficients can be linear and/or non-linear. Further description of parametric representation of a lithography model can be found in co-owned provisional application No. 61/425,717, titled, "Information Matrix Creation and Calibration Test Pattern Selection Based on Computational Lithography Model Parameters," filed on Dec. 21, 2010. In the present invention, the non-linear coefficients are used for contour noise estimation. Moreover, actual design patterns (full-chip design layout or portions thereof) are used for a more realistic calibration of the simulation model rather than using just test patterns.

As will be appreciated by persons skilled in the art, both linear and non-linear coefficients of the lithography model can be thought of as being contaminated by noise, because the input to the model is CD values with noise (step 304). In the illustrative examples of the invention, this application shows estimation of noise on the linear coefficient while sweeping through the non-linear coefficients. Finally, this model is used to compute an image contour (step 308, such as a resist image contour (also referred to as resist contour). Optionally, a high level inspection/verification step, such as, Lithography Manufacturability Check (LMC), OPC, or source mask optimization (SMO) may be used as a feedback step to improve the contour prediction is step 308. For example, an LMC step may be optionally done to add hotspots/warm-spots to a calibration pattern set whose CD values are considered. The noise on the coefficients in the model creates some uncertainty in the image contour predicted in step 308. One can consider this uncertainty as noise.

Figure 4:
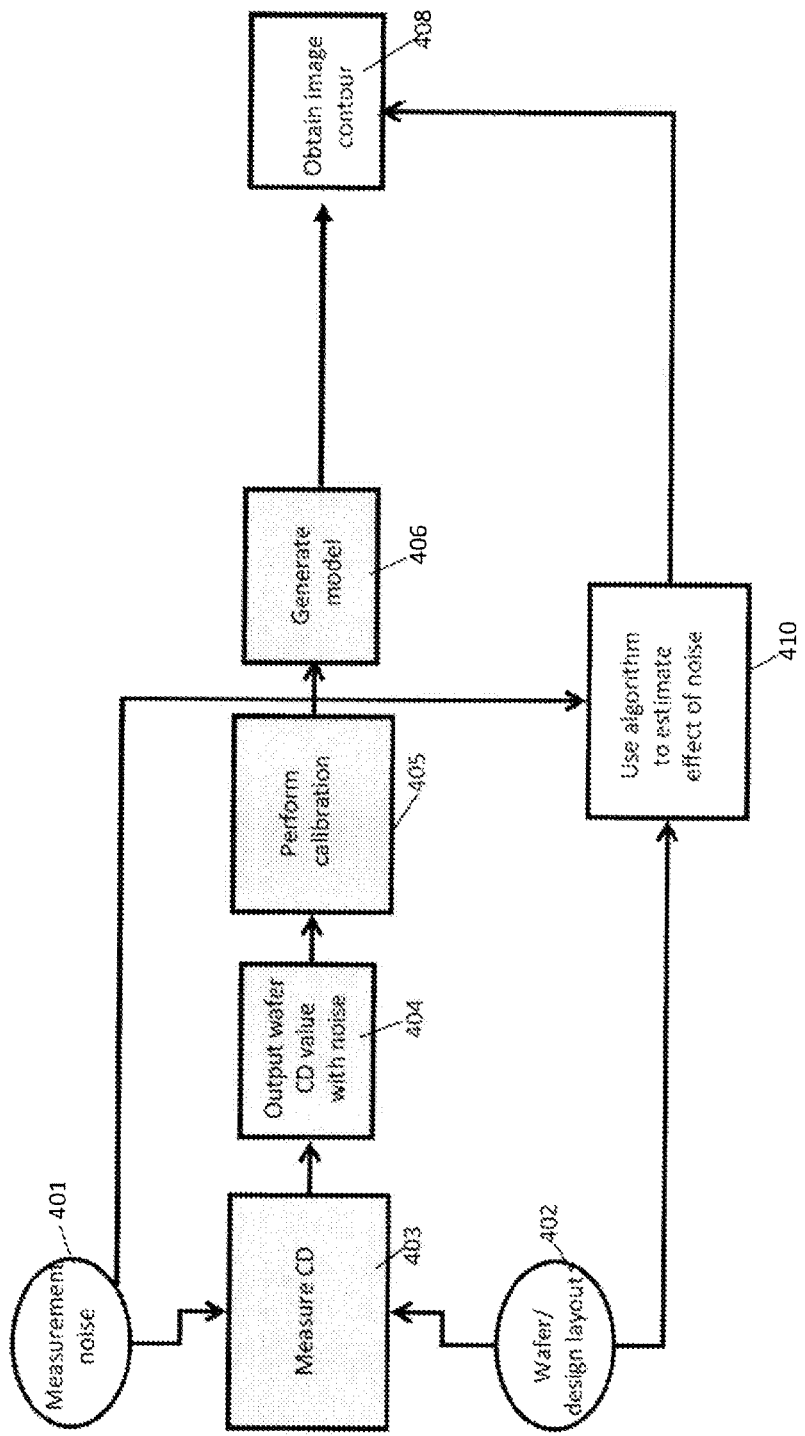
FIG. 4 is a flow diagram illustrating how effect of measurement noise can be estimated by using a suitable algorithm according to aspects of the invention.

FIG. 4 illustrates some key steps of the methodology used in the embodiments of the present invention. The central idea in FIG. 4 is to include measurement noise from test patterns in an algorithm to predict noise in the image contours associated with actual patterns in a design layout by using a smart algorithm that obviates the need for actual CD measurement. Steps 401 through 408 are the equivalent of steps 301 through 308 of FIG. 3, respectively. Since one of the objectives of this invention is to know which patterns to put on a mask, instead of using measurement data from an actual wafer, a design layout is used in step 402, and instead of the steps 403-406 (shown as grayed out blocks), an algorithm is used (step 410) to estimate the effect of noise by performing simulation.

One of the challenges that is encountered is to know where the image contours of the model are. The present invention circumvents this problem. Instead of trying to know where the contours are, it only tries to estimate the noise on the contour. This simplification allows a lithographer to bypass the requirement of having measured wafer CDs. The algorithm (step 410) is further detailed in FIG. 5.

Figure 5:
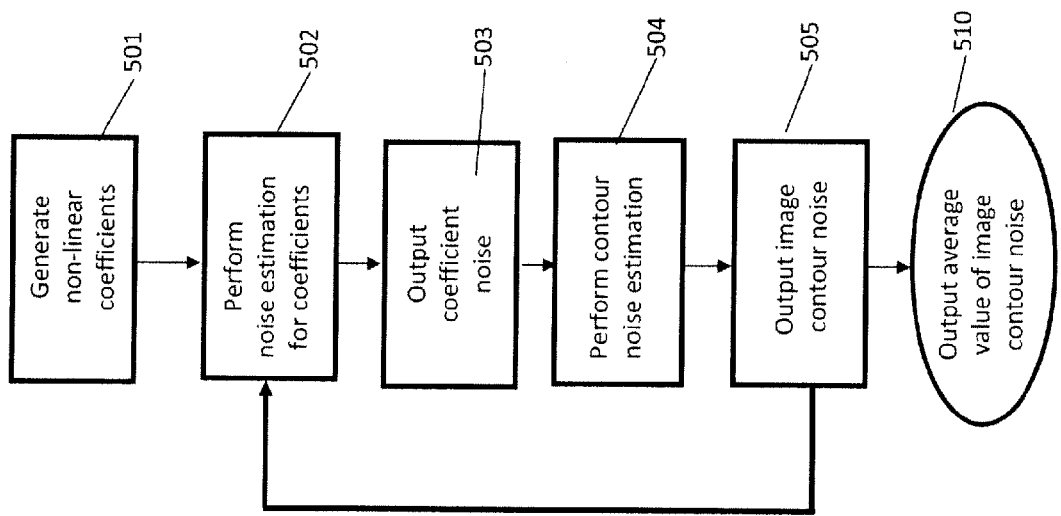
FIG. 5 is a flow diagram depicting example steps of a methodology used in estimating a resist contour, according to aspects of the present invention.

As mentioned above, one of the purposes of this algorithm is to estimate the noise on the predicted image contour (step 510). To do so, it is recognized that the resist models contain both linear and non-linear coefficients. The algorithm therefore sweeps through all the combinations of non-linear parameters to generate non-linear coefficients (step 501). For convenience, only one branch of the algorithm is shown in FIG. 5, but it is understood that there are many more parallel branches to individually generate image contour noise (step 505), as the operation loops through, as shown in FIG. 5. Then all the individual noises are averaged in step 510 to obtain overall estimate of contour noise.

For each branch of the algorithm, first the noise on the coefficients is estimated (step 502), and the result is outputted in step 503. Then, the noise on the contours is estimated in step 504, and the result is outputted in step 505. The algorithm of FIG. 5 may involve various mathematical techniques. One such technique may involve creation of various matrices and their singular value decompositions (SVDs), as will be discussed further below. The terms of the matrices parametrically represent various lithography responses. The mathematical framework of the steps of the algorithm in FIG. 5 is described below.

Coefficient Noise Estimation

The goal for step 502 is to estimate the noise on a vector x which represents the coefficients of the model. The vector x minimizes the following example merit function (also known as cost function) J:

$$J = \|A_1 x - (z+\eta)\|^2 \quad (1a)$$

where z is the true wafer CD and $\eta$ is a noise random variable that is assumed to be Gaussian independent identically distributed (i.i.d.) variable.

A matrix $A_1$ of size (n, 2p) is defined. The number of rows 'n' is equal to the number of test patterns. The number of response parameters is denoted as 'p', and since there are two edges to each test pattern, the number of columns of the matrix is 2p. The $i^{th}$ row and the $j^{th}$ column of this matrix contains the response of the $j^{th}$ term of the resist model at the one edge of the $i^{th}$ gauge divided by, for example, the slope of the aerial image at the same location. Note that normalization by the aerial image slope is just one option. Normalization by other lithography response values can be done too. This way the terms of the matrix are normalized. The $i^{th}$ row and the $j+n^{th}$ column contains the response at the other edge divided by the slope of the aerial image at that location. Optionally, one can take into account a weight on each gauge. An SVD of $A_1$ is performed to get:

$$A_1 = U_1 S_1 V_1' \quad (1b)$$

Where both $U_1$ and $V_1$ are unitary matrix, and $S_1$ is a rectangular matrix of the same size as $A_1$ with non-zero values only in its diagonal. The apostrophe ' means a transposition of the matrix. In performing SVD, the singular values are ordered by decreasing magnitude.

Another (n, 2p) matrix $A_2$ is also created. The $i^{th}$ row and the $j^{th}$ column of A2 contains the response of the $j^{th}$ term of the resist model at the one edge of the gauge. The row and the $j+n^{th}$ column contains the response at the other edge. Optionally, one can take into account a weight factor on each gauge based on the contribution of that gauge into the SVD calculation. Matrix $A_2$ is denoted as:

$$A_2 = U_2 S_2 V_2' \quad (1c)$$

Where both $U_2$ and $V_2$ are unitary matrix, and $S_2$ is a rectangular matrix of the same size as $A_2$ with non-zero values only in its diagonal. The apostrophe ' means a transposition of the matrix.

The two matrices have two different roles. The matrix $A_1$ is used to estimate the sum of the CD and the error on the measurement on the test patterns. If the vector x contains the p coefficient values repeated twice, then $A_1 x$ is an approximation of the CD error. The matrix $A_2$ is an estimate of the matrix that is used in the calibration algorithm to control overfitting. The number of terms used in the matrices can be kept limited based on physical constraints of the lithography process. The physical constraints represent physical restrictions in a hardware implementation of a lithographic projection apparatus that is used to perform the lithography process. Examples of the physical constraints include tuning range of illumination, tuning range of projection optics, rules governing mask manufacturability, interdependence between the parameters of the model, etc.

If the weight W of different gauges is taken into account, the merit function becomes:

$$J = \|W A_1 x - W(z+\eta)\|^2 \quad (2)$$

Doing the SVD on $W A_1$, we get:

$$J = \|U_1 S_1 V_1' x - W(z+\eta)\|^2 \quad (3)$$

Since the matrix $U_1$ is unitary, and after the change of variable $y = V_1' x$, we have:

$$J = \|S_1 y - U_1' W(z+\eta)\|^2 \quad (4)$$

The covariance matrix of $U_1' W(z+\eta)$ in equation 4 is denoted with the letter E. Since z is non-random, we discard it and the covariance matrix is:

$$E = E\{(U_1' W \eta)(U_1' W \mu)\} = U_1 W E\{\eta \eta'\} W' U_1 \quad (5)$$

Since the random variable $\eta$ is Gaussian i.i.d, its covariance matrix is a multiple of the identity matrix and we take its standard deviation to be $\sigma$. The covariance matrix E become:

$$E = \sigma^2 U_1 W W' U_1 \quad (6)$$

The expression above can be further simplified by discarding the off-diagonal elements. This is an approximation, but in practice, it has given acceptable results. This matrix is written as $E_d$ and its diagonal elements $e_{i,i}$. Next step is to find the covariance matrix of y. If no special operation is done to prevent overfitting, then the covariance matrix of y, denoted with the letter F is diagonal and has coordinates:

$$f_{i,i} = \frac{e_{i,i}}{\sigma_{1,i}^2} \quad (7)$$

Another simplification is made here in assuming that matrices resulting from rotation operations ($V_1$ and $V_2$, described above) are identical. In practice, this means that the values of for $\sigma_{1,i}$ are not exact, but their order of magnitude should be close enough. Thus, vectors $y_1$ and $y_2$ can be rewritten as y.

If i>N, where N is the number of coordinates that have non-zero values, then $y_i$=0; its variance is zero. Otherwise, the variable $y_i$ is a Gaussian variable that is limited in magnitude. Its original standard deviation is $\sigma^2/e_{i,i}$ and the limit is calculated during an optional subsequent operation to control overfitting. The variance of this variable can also be computed using known mathematical operations. Thus, the diagonal values of $f_{i,i}$ can be computed.

A third matrix A is constructed using exactly the same method as for matrix $A_1$. However, instead of using the test gauges, full-chip gauges are used to estimate CD error.

Contour Noise Estimation

In the previous section, it is described how the matrix F, the covariance matrix of y is estimated. Also of interest is the noise level on the full chip. Step 504 describes contour noise estimation.

Reverting the change of variable, we get that the covariance matrix of x is $V_1 FCV_1'$. Finally, to get the covariance matrix of the full chip, one needs to compute $A(V_1 FCV_1') A'$.

Below is an example source code describing these operations.

```
[U1, S1, V1]=svd(A1); % We cannot use the 'economy size' SVD s1=diag(S1);
[U2, S2, V2]=svd(diag(wt2)*A2); % We cannot use the 'economy size' SVD
s2=diag(S2);
n_drop=sum(s2<s2 (1)*regDropKer);
n=length(s2)-n_drop;
pro=prod(s2(1:n)).^(1/n);
if use_wt1
   E=(U1'*diag(w1))*(U1'*diag(w1))';
else
   E=U1'*U1; % The identity
end
E_diag=diag(E);
n_coef=min(length(E_diag), sum(s2>=s2(1)*regDropKer));
Ek=sqrt(sum(E_diag)/sum(E_diag(1:n_coef)))
E=E/Ek;
F=zeros (1, size (S2, 2));
for ii=1:min(length(E_diag), length(s2))
   if(s2(ii)<s2(1)*regDropKer)
     F(ii)=0;
   else
     F(ii)=trunc_gauss_var(sigma_nm*sqrt(E(ii, ii))/s1(ii), s2(ii)*regRange/pro);
   end
end
F=diag(F);
sigma=diag(A*(V1*F*V1')*A');
```

Persons skilled in the art will understand that the copyrighted source code shown above is just an illustrative example, and will vary depending on which computer program is used to generate the code.

In general, in the above code, a procedure is described in terms of predicting in advance which patterns in the full chip will have large uncertainty. Note that application of the code can be used in various ways to select optimum patterns for lithography model calibration. An example first way is to decimate the calibration gauge set so that a user has a smaller calibration set to deal with, but at the same time the noise level of the full chip resist contour is acceptable. An example second way is to "repair" the calibration gauge set so that the full chip contour is less noisy. This can be accomplished by using full chip clips and adding them to the calibration set, or adding user-designed gauges from the calibration set, or a combination thereof. Choosing a final set of calibration pattern may involve pruning an initially chosen set of patterns using the overall noise estimation to obtain an optimal set of calibration patterns that minimizes calibration run time. Another option is adding only certain of the initially chosen set of patterns to a final set of calibration patterns using the overall noise estimation. One possible option is to include the worst-predicted patterns into the calibration set. In both the instances, a known set of calibration patterns may always be included in the final set based on previous experience.

Persons skilled in the art will understand that, although the invention has been described in an example application of lithography model calibration, it is possible that aspects of the invention can be applied to calculating individual terms in resist modeling, differential optical modeling, and selection of appropriate model etc.

Figure 6:
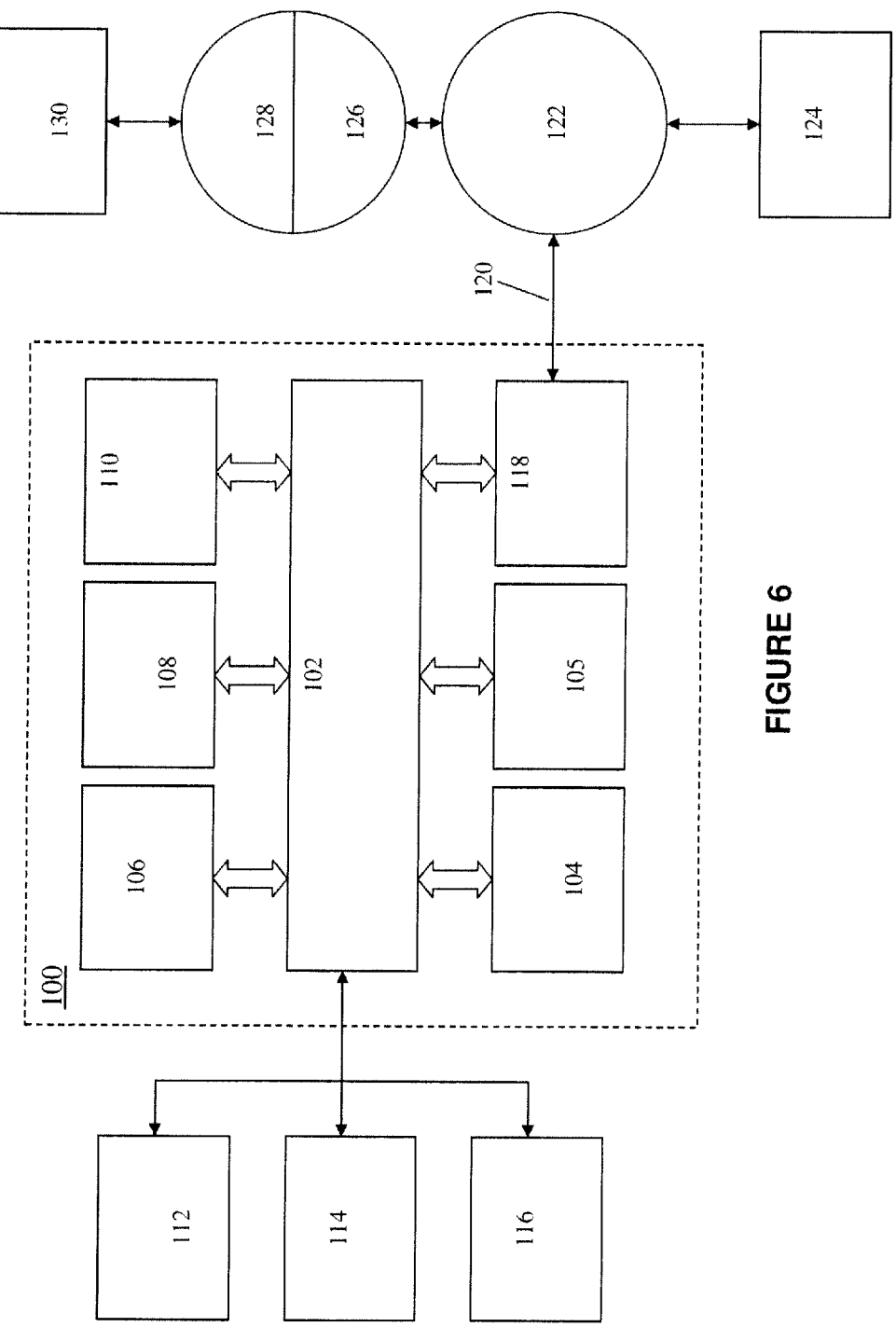
FIG. 6 is a block diagram of an example computer system in which embodiments of the invention can be implemented.

Details of a Computer System for Implementing the Embodiments of the Present Invention FIG. 6 is an exemplary block diagram that illustrates a computer system 100 which can assist in embodying and/or implementing the pattern selection method disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

Example Lithography Tool

Figure 7:
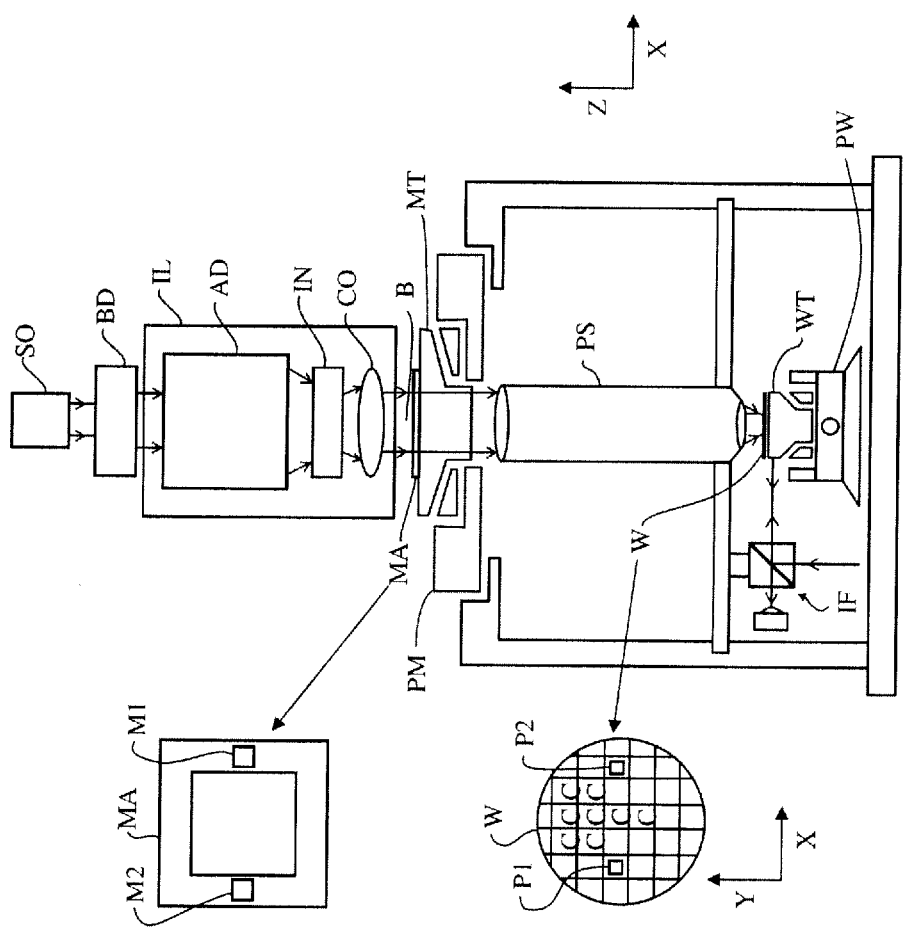
FIG. 7 is a schematic diagram of a lithographic projection apparatus to which embodiments of the invention are applicable.

FIG. 7 schematically depicts an exemplary lithographic projection apparatus whose performance could be simulated and/or optimized utilizing the computational lithography models that are calibrated using the test pattern selection process of present invention. The apparatus comprises:

a radiation system IL, for supplying a projection beam B of radiation. In this particular case, the radiation system also comprises a radiation source SO;

a first object table (mask table) MT provided with a mask holder for holding a mask MA (e.g., a reticle), and connected to first positioning means PM for accurately positioning the mask with respect to projection system PS;

a second object table (substrate table) WT provided with a substrate holder for holding a substrate W (e.g., a resist-coated silicon wafer), and connected to second positioning means PW for accurately positioning the substrate with respect to projection system PS;

a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 7 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F$_2$ lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 7. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam B is caused to scan over a mask image; concurrently, the substrate table WT is simultaneously moved in the same or opposite direction at a speed V=Mv, in which M is the magnification of the lens PS (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modification.

What is claimed is:

1. A method implemented by a computer, comprising:
   identifying a model of at least a portion of a lithographic process;
   identifying a set of patterns for calibrating the model;
   executing, using the computer, an algorithm that produces as an output an estimate of measurement noise of measurements associated with the set of patterns without physically measuring a lithographic process response of the set of patterns; and
   adjusting the set of patterns such that an adjusted estimated measurement noise associated with the adjusted set of patterns is less than the estimated measurement noise.

2. The method according to claim 1, wherein the model comprises a resist model.

3. The method according to claim 1, wherein the set of patterns comprise a set of design patterns from or representing a design layout or a portion thereof.

4. The method according to claim 1, wherein the estimating includes:
   estimating a model noise in the model based on the set of test patterns; and
   applying the estimated model noise obtained from the set of test patterns to the set of patterns to arrive at the estimated measurement noise on the set of patterns.

5. The method according to claim 4, wherein the estimating a model noise includes:
   building a first matrix corresponding to parameters of the model and model responses associated with the set of test patterns;
   building a second matrix corresponding to the parameters of the model and the model responses associated with the set of test patterns normalized by a lithography response value; and
   estimating a model noise in a model output of the model using the first matrix and the second matrix.

6. The method according to claim 5, further comprising:
   based on physical constraints of the lithography process, limiting terms used in estimating the model noise in the model output to prevent overfitting, the physical constraints representing physical restrictions in a hardware implementation of a lithographic projection apparatus that is used to perform the lithography process.

7. The method according to claim 6, wherein the physical constraints include tuning range of illumination, tuning range of projection optics, rules governing mask manufacturability, and interdependence between the parameters of the model.

8. The method according to claim 5, wherein applying the estimated model noise includes:
   building a full chip matrix, wherein the full chip matrix corresponds to parameters of the model and simulation values associated with a set of patterns representing a behavior expected from a design layout of an entire chip; and applying the estimated model noise to the full chip matrix to arrive at the estimated measurement noise on the set of patterns representing the behavior expected from the design layout of the entire chip.

9. The method according to claim 5, wherein the model responses are determined at edges of the patterns in the set of patterns.

10. The method according to claim 5, wherein each pattern of the set of patterns has an associated weight.

11. The method according to claim 5, wherein a lithography response value used for normalization comprises an aerial image slope.

12. The method according to claim 5, wherein the measurement comprises critical dimension.

13. The method according to claim 12, wherein the estimating further includes:

repeating, for a plurality of non-linear coefficients included in a mathematical representation of a lithography response term, the steps of estimating noise and using the estimated noise to obtain respective results of estimated noise on image contours of the set of patterns; and averaging the respective results to obtain an overall noise estimation on the image contours.

14. The method according to claim 13, further comprising:
pruning the set of patterns using the overall noise estimation to obtain an improved set of calibration patterns.

15. The method according to claim 13, further comprising: adding certain patterns of the set of patterns to a final set of calibration patterns using the overall noise estimation.

16. A non-transitory computer readable storage medium storing instructions which, when executed by a computer, cause the computer to perform a method comprising:

identifying a model of at least a portion of a lithographic process;

identifying a set of patterns for calibrating the model;

executing, using the computer, an algorithm that produces as an output an estimate of measurement noise of measurements associated with the set of patterns without physically measuring a lithographic process response of the set of patterns; and adjusting the set of patterns such that an adjusted estimated measurement noise associated with the adjusted set of patterns is less than the estimated measurement noise.

17. The non-transitory computer readable storage medium according to claim 16, wherein the estimating includes:

estimating a model noise in the model based on a set of test patterns; and applying the estimated model noise obtained from the set of test patterns to the set of patterns to arrive at the estimated measurement noise on the set of patterns.

18. The non-transitory computer readable storage medium according to claim 17, wherein the estimating a model noise includes:

building a first matrix corresponding to parameters of the model and model responses associated with the set of test patterns;

building a second matrix corresponding to the parameters of the model and the model responses associated with the set of test patterns normalized by a lithography response value; and estimating a model noise in a model output of the model using the first matrix and the second matrix.

19. The non-transitory computer readable storage medium according to claim 18, wherein the method further comprises:

based on physical constraints of the lithography process, limiting terms used in estimating the model noise in the model output to prevent overfitting, the physical constraints representing physical restrictions in a hardware implementation of a lithographic projection apparatus that is used to perform the lithography process.

20. The non-transitory computer readable storage medium according to claim 19, wherein the physical constraints include tuning range of illumination, tuning range of projection optics, rules governing mask manufacturability, and interdependence between the parameters of the model.

* * * * *

UNITED STATES PATENT AND TRADEMARK OFFICE
CERTIFICATE OF CORRECTION

PATENT NO.         : 8,887,105 B1
APPLICATION NO.    : 13/662239
DATED              : November 11, 2014
INVENTOR(S)        : Antoine Jean Bruguier et al.

Page 1 of 1

It is certified that error appears in the above-identified patent and that said Letters Patent is hereby corrected as shown below:

On title page, item (71) Applicants, Line 2
   replace "Sunnyvalle, CA"
   with --Sunnyvale, CA--.

On title page, item (72) Inventors, Line 2
   replace "Sunnyvalle, CA"
   with --Sunnyvale, CA--.

On title page, item (56) References Cited - U.S. Patent Documents
before line 5, insert --7,703,069  B1  04/2010  Liu et al.--.

On title page, item (56) References Cited - U.S. Patent Documents
after line 5, insert --2010/0122225  A1  05/2010  Cao et al.
                      2010/0128969  A1  05/2010  Cao et al.
                      2010/0141925  A1  06/2010  Cao et al.
                      2010/0146475  A1  06/2010  Cao et al.
                      2011/0224956  A1  09/2011  Ye et al.--.

On title page, item (56) References Cited
after line 6, insert --OTHER PUBLICATIONS Young-Chang Kim et al., "Optical Proximity Correction for Elongated Contact-Hole Printing," Proc. of SPIE, Vol. 6924, pp. 69243Q-1 - 69243Q-11 (2008).
Kyle Patterson et al., "Improving Model-Based OPC Performance for the 65nm Node Through Calibration Set Optimization," Proc. of SPIE, Vol. 5756, pp. 294-301 (2005).
Yuyang Sun et al., "Optimizing OPC data sampling based on "orthogonal vector space"," Proc. of SPIE, Vol. 7973, pp. 79732K-1 - 79732K-10 (2011).--.

Signed and Sealed this
Seventeenth Day of March, 2015

Michelle K. Lee
*Director of the United States Patent and Trademark Office*